United States Patent
Niwa

[11] Patent Number: 5,998,241
[45] Date of Patent: Dec. 7, 1999

[54] SEMICONDUCTOR DEVICE AND METHOD OF MANUFACTURING THE SAME

[75] Inventor: Kouichirou Niwa, Tokyo, Japan

[73] Assignee: NEC Corporation, Tokyo, Japan

[21] Appl. No.: 09/207,557

[22] Filed: Dec. 8, 1998

[30] Foreign Application Priority Data

Dec. 8, 1997 [JP] Japan .................................. 9-337510

[51] Int. Cl.⁶ .................................................. H01L 21/44
[52] U.S. Cl. ........................ 438/122; 438/111; 438/123; 257/675; 257/712; 257/706; 257/707
[58] Field of Search .................... 438/107, 111, 438/112, 122, 123; 257/675, 706, 712, 713, 717, 796, 707

[56] References Cited

U.S. PATENT DOCUMENTS

| | | | |
|---|---|---|---|
| 4,843,808 | 7/1989 | Karnezos ................................ | 438/122 |
| 5,016,084 | 5/1991 | Nakao .................................... | 438/123 |
| 5,244,838 | 9/1993 | Casati et al. ........................... | 438/122 |
| 5,474,957 | 12/1995 | Urushima ............................... | 438/123 |
| 5,492,866 | 2/1996 | Nishikawa ............................. | 438/112 |
| 5,786,239 | 7/1998 | Ohsawa et al. ........................ | 438/123 |
| 5,877,042 | 3/1999 | Mattson et al. ........................ | 438/123 |
| 5,909,056 | 6/1999 | Mertol .................................... | 257/712 |

FOREIGN PATENT DOCUMENTS

| | | |
|---|---|---|
| 9-97856 | 4/1997 | Japan . |
| 9-199631 | 7/1997 | Japan . |

*Primary Examiner*—Kevin M. Picardat
*Attorney, Agent, or Firm*—Foley, Hoag & Eliot LLP

[57] ABSTRACT

A semiconductor device includes a tape carrier, a semiconductor chip, a metal heat spreader, a support ring, and a projection, recess, and spot welding portion. The tape carrier includes a TAB tape. The semiconductor chip is mounted on the tape carrier. The metal heat spreader is fixed to a surface of the semiconductor chip opposite to the tape carrier to dissipate heat generated in the semiconductor chip. The heat spreader has a shape larger than that of the semiconductor chip. The support ring is arranged between the heat spreader and tape carrier and is adhered to the tape carrier. The support ring serves to ensure a predetermined gap between the heat spreader and the tape carrier and to prevent warp of the tape carrier. The projection, recess, and spot welding portion bond the heat spreader and reinforcing member to each other by employing one of mechanical engagement and fusion welding. A method of manufacturing a semiconductor device is also disclosed.

19 Claims, 11 Drawing Sheets

SEMICONDUCTOR DEVICE AND METHOD OF MANUFACTURING THE SAME

BACKGROUND OF THE INVENTION

The present invention relates to a semiconductor device and a method of manufacturing the same and, more particularly, to a semiconductor device having a heat spreader for dissipating heat generated in a semiconductor chip and a reinforcing member for preventing warp of a tape carrier, and a method of manufacturing the same.

Conventionally, as a method for realizing high-density mounting of semiconductor chips, a package called a tape-BGA (Ball Grid Array) in which a semiconductor chip is mounted on a tape carrier and which has bump electrodes is utilized.

Figure 17:
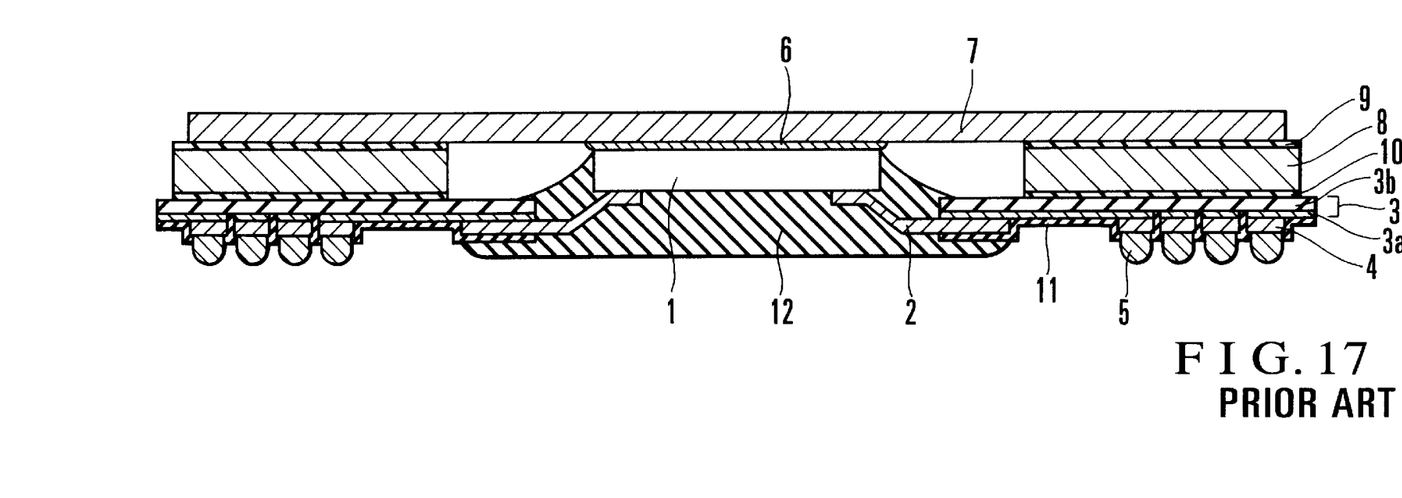
FIG. 17 is a sectional view of a conventional semiconductor device.

FIG. 17 shows a conventional semiconductor device. As shown in FIG. 17, a semiconductor chip 1 is connected to copper foils 3a of TAB (Tape Automated Bonding) tapes 3 through inner leads 2. Each TAB tape 3 is constituted by a polyimide tape 3b and the copper foils 3a formed on the tape 3b to form a desired interconnection pattern. The TAB tape 3, together with the inner leads 2 and external electrodes 4, constitutes a tape carrier for mounting the semiconductor chip 1 thereon.

The various types of terminals (not shown) of the semiconductor chip 1 are electrically connected to bump electrodes 5 through the inner leads 2, copper foils 3a, and external electrodes 4.

A heat spreader 7 is attached to a surface of the semiconductor chip 1, opposite to a surface where the inner leads 2 are to be connected, through a copper paste 6. The heat spreader 7 dissipates heat generated during operation of the semiconductor chip 1 to the outside. Around the semiconductor chip 1, a support ring 8 serving as a reinforcing member having a thickness larger than that of the semiconductor chip 1 is interposed between the heat spreader 7 and TAB tapes 3, to prevent warp of the TAB tapes 3. The two surfaces of the support ring 8 are adhered to the heat spreader 7 and TAB tapes 3 through adhesive portions 9 and 10.

The external electrodes 4 exposed around the bump electrodes 5 are coated with a cover resist 11. The semiconductor chip 1 and inner leads 2 are sealed with a potting resin 12. The potting resin 12 maintains electrical insulation and protects the semiconductor chip 1 from an external stress, humidity, and the like.

In this manner, in the conventional semiconductor device, the adhesive portions 9 and 10 are used to bond the heat spreader 7 and support ring 8 to each other.

When, however, a large amount of adhesive is used in the manufacture of the package, the adhesive power is decreased due to the heat history in reflow during mounting or the like, to cause peeling. This is because the adhesive is melted by heat or the water content contained in the adhesive is vaporized to swell. If the adhesive is used, these problems are difficult to avoid.

SUMMARY OF THE INVENTION

It is an object of the present invention to provide a semiconductor device in which use of the adhesive is reduced as much as possible so that peeling does not easily occur even if heat acts on it, and a method of manufacturing the same.

In order to achieve the above object, according to the present invention, there is provided a semiconductor device comprising a tape carrier constituted by a TAB (Tape Automated Bonding) tape, a semiconductor chip mounted on the tape carrier, a metal heat spreader fixed to a surface of the semiconductor chip opposite to the tape carrier to dissipate heat generated in the semiconductor chip, the heat spreader having a shape larger than that of the semiconductor chip, a reinforcing member arranged between the heat spreader and the tape carrier and adhered to the tape carrier, the reinforcing member serving to ensure a predetermined gap between the heat spreader and the tape carrier and to prevent warp of the tape carrier, and a bonding structure for bonding the heat spreader and the reinforcing member to each other by employing one of mechanical engagement and fusion welding.

DESCRIPTION OF THE PREFERRED EMBODIMENTS

The present invention will be described in detail with reference to the accompanying drawings.

Figure 1:
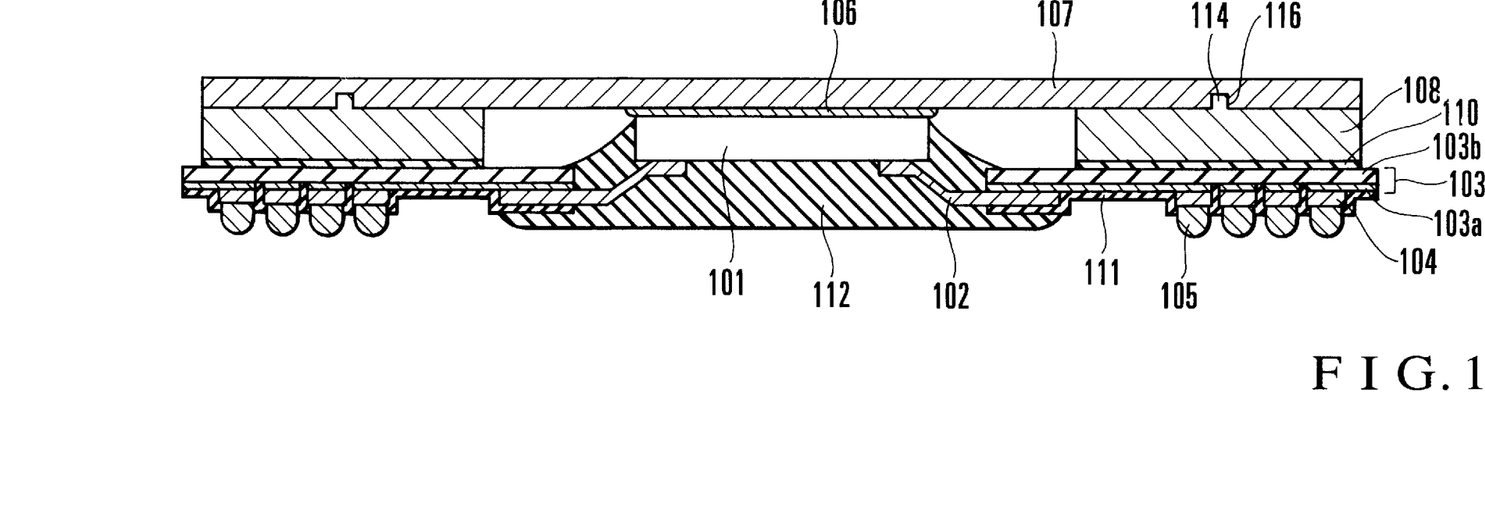
FIG. 1 is a sectional view of a semiconductor device according to the first embodiment of the present invention.

FIG. 1 shows the first embodiment of the present invention. Referring to FIG. 1, a semiconductor chip 101 is connected to copper foils 103a of TAB tapes 103 through inner leads 102. Each TAB tape 103 is constituted by a polyimide tape 103b and the copper foils 103a formed on the tape 103b to form a desired interconnection pattern. The TAB tape 103, together with the inner leads 102 and external electrodes 104, constitutes a tape carrier for mounting the semiconductor chip 101 thereon.

The various types of terminals (not shown) of the semiconductor chip 101 are electrically connected to bump electrodes 105 through the inner leads 102, copper foils 103a, and external electrodes 104.

A heat spreader 107 is attached to a surface of the semiconductor chip 101, opposite to a surface where the inner leads 102 are to be connected, through a copper paste 106. The heat spreader 107 dissipates heat generated during operation of the semiconductor chip 101 to the outside. Around the semiconductor chip 101, a support ring 108 serving as a reinforcing member having a thickness larger than that of the semiconductor chip 101 is interposed between the heat spreader 107 and TAB tapes 103, to prevent warp of the TAB tapes 103. One surface of the support ring 108 is adhered to the TAB tapes 103 through an adhesive 110, while the other surface thereof is fixed to the heat spreader 107 by caulking.

The external electrodes 104 exposed around the bump electrodes 105 are coated with a cover resist 111. The semiconductor chip 101 and inner leads 102 are sealed with a potting resin 112. The potting resin 112 maintains electrical insulation and protects the semiconductor chip 111 from an external stress, humidity, and the like.

The characteristic feature of this embodiment resides in that the heat spreader 107 and support ring 108 are joined to each other by caulking.

Figure 2:
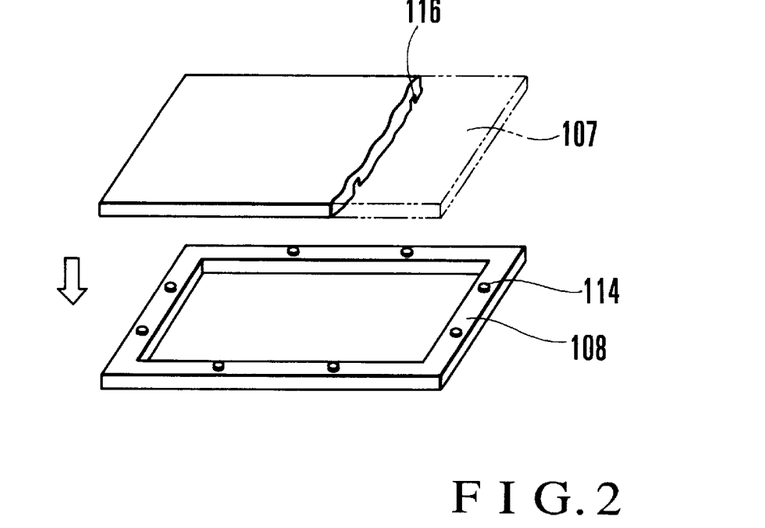
FIG. 2 is a perspective view of a heat spreader and support ring shown in FIG. 1.

FIG. 2 shows the heat spreader 107 and support ring 108 before bonding. As shown in FIG. 2, a plurality of projections 114 are formed at the desired positions of the support ring 108 in advance. Recesses 116 slightly smaller than the projections 114 are formed in the heat spreader 107 at positions corresponding to the projections 114.

The steps in bonding the heat spreader 107 and support ring 108 will be described with reference to FIGS. 3A to 3C.

Figure 3A:
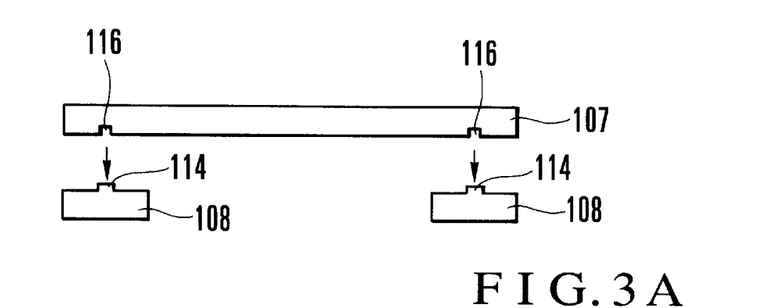
FIGS. 3A to 3C are views showing the steps in bonding the heat spreader and support ring shown in FIG. 1.
Figure 3B:
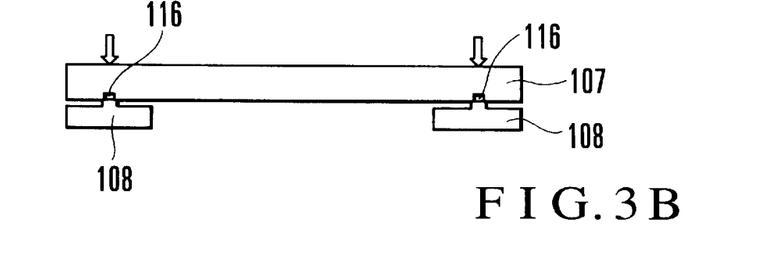
Figure 3C:
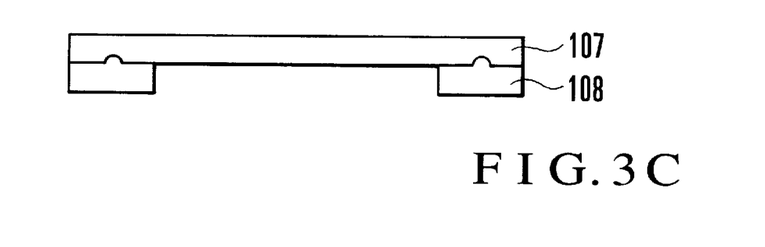

As shown in FIG. 3A, the recesses 116 of the heat spreader 107 and the projections 114 of the support ring 108 are aligned with each other. As shown in FIG. 3B, the projections 114 are engaged in the recesses 116 and pressed from the heat spreader 107 side. Hence, as shown in FIG. 3C, the projections 114 and the recesses 116 are fitted with each other, and a metal is plastically fluidized at the fitted portions to bond the heat spreader 107 and support ring 108 to each other.

Figure 4:
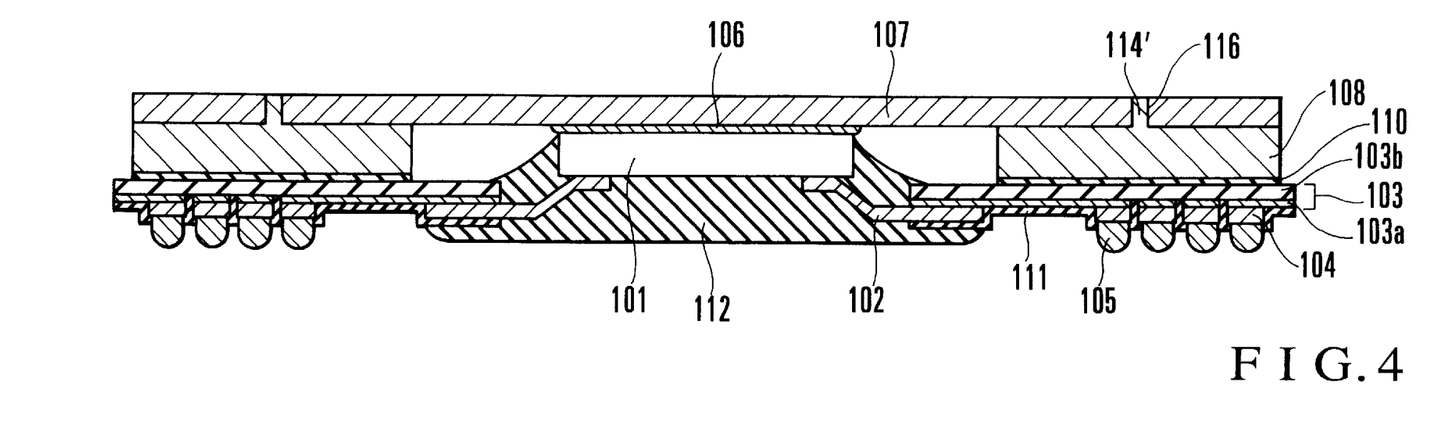
FIG. 4 is a sectional view showing a modification of the semiconductor device shown in FIG. 1.

As shown in FIG. 4, projections 114' may be formed to have such a length that they can extend through a heat spreader 107, and the distal ends of the projections 114' that project from the heat spreader 107 may be squeezed to bond the heat spreader 107.

Figure 5:
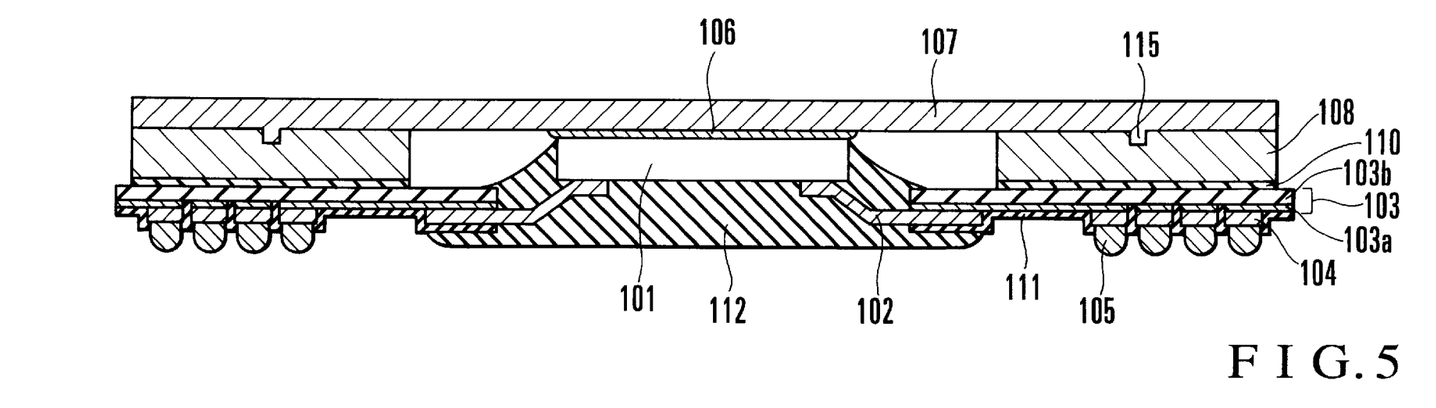
FIG. 5 is a sectional view showing another modification of the semiconductor device shown in FIG. 1.
Figure 6:
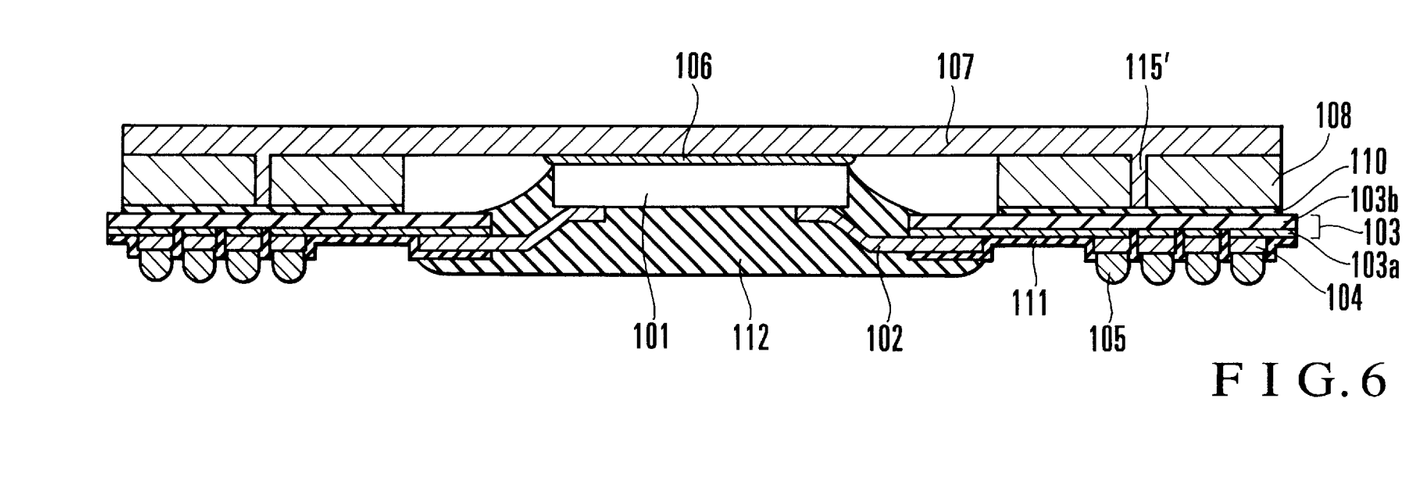
FIG. 6 is a sectional view showing still another modification of the semiconductor device shown in FIG. 1.

As shown in FIG. 5 or 6, projections 115 or 115' may be formed on a heat spreader 107. In FIG. 5, the projections 115 formed on the heat spreader 107 have a length smaller than the thickness of a support ring 108. In FIG. 6, the projections 115' have such a length that they can extend through a support ring 108.

The numbers and positions of the projections 114, 114', 115, and 115' and the recesses 116 may be arbitrarily selected to obtain a desired strength.

A second embodiment in which the heat spreader 107 and support ring 108 are bonded to each other without using an adhesive will be described.

Figure 7:
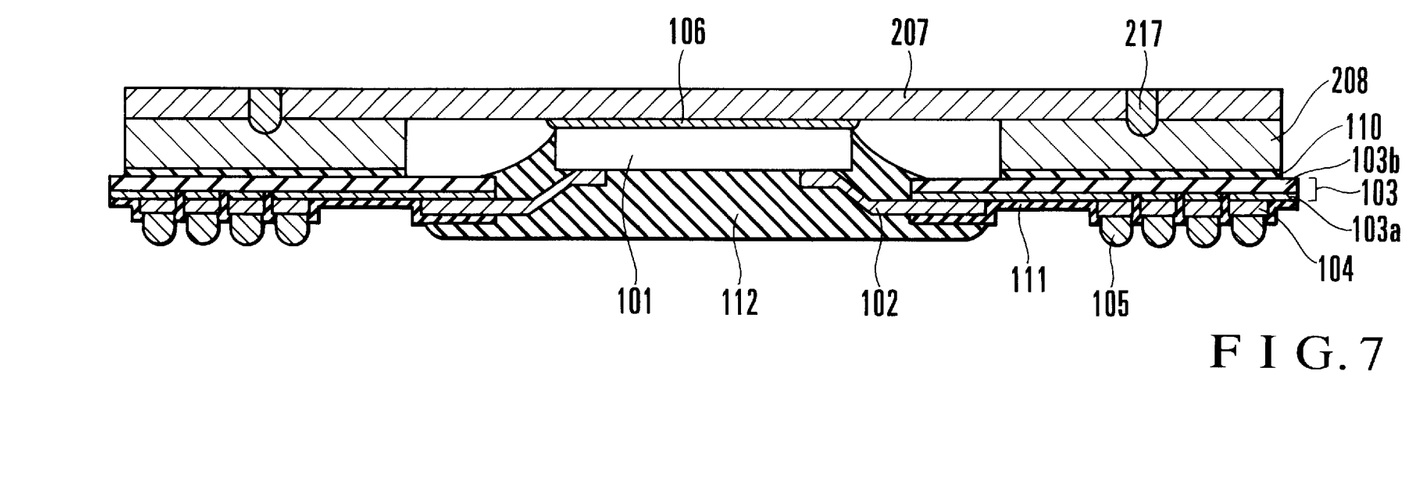
FIG. 7 is a sectional view of a semiconductor device according to the second embodiment of the present invention.

FIG. 7 shows a semiconductor device according to the second embodiment of the present invention. Referring to FIG. 7, the same elements as those in FIG. 1 are denoted by the same reference numerals as in FIG. 1, and a detailed description thereof will be omitted. The difference between FIGS. 7 and 1 resides in that, in FIG. 7, a heat spreader 207 and support ring 208 are bonded (by fusion welding) by using spot welding. Reference numeral 217 denotes a spot welding portion.

The steps in bonding the heat spreader 207 and support ring 208 to each other will be described with reference to FIGS. 8A and 8C.

Figure 8A:
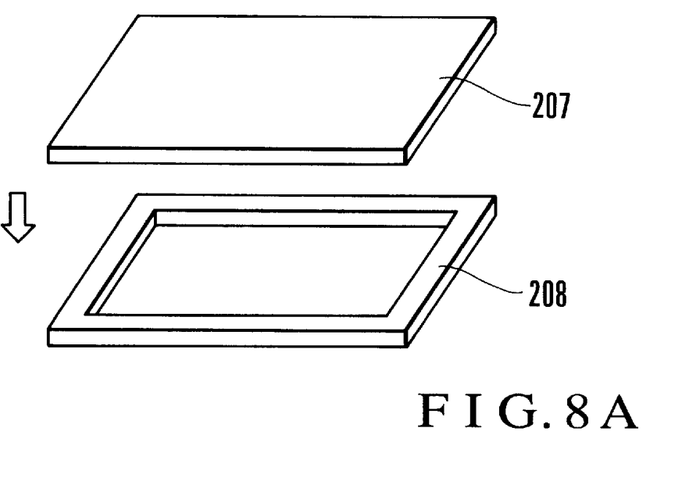
FIGS. 8A to 8C are views showing the steps in bonding the heat spreader and support ring shown in FIG. 7.
Figure 8B:
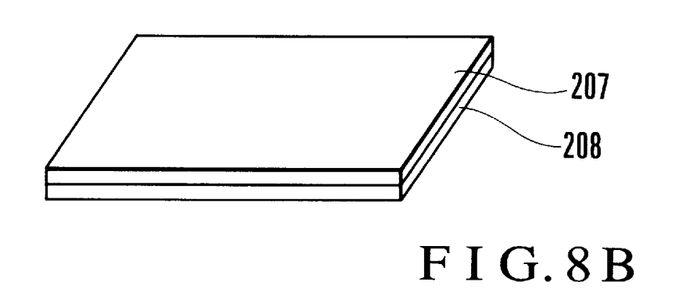
Figure 8C:
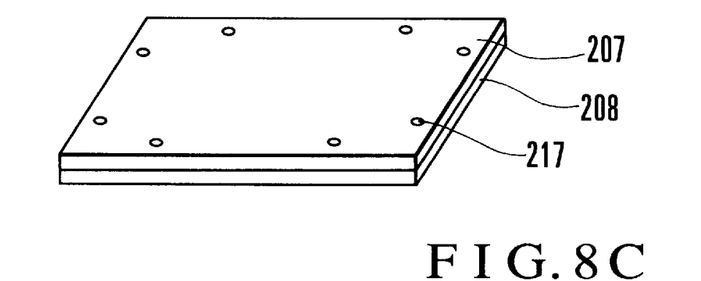

First, as shown in FIG. 8A, the heat spreader 207 and support ring 208 are aligned with each other. As shown in FIG. 8B, the heat spreader 207 is placed on the support ring 208. As shown in FIG. 8C, the mating surfaces of the heat spreader 207 and support ring 208 are spot-welded at a desired number of portions so as to obtain a sufficiently high strength. More specifically, a voltage is applied, together with a pressure, from the heat spreader 207 to form two spot welding portions 217 on each side, thereby bonding the heat spreader 207 and support ring 208 to each other.

A case wherein the support ring 308 is formed by using a resin, unlike in the case employing a metal support ring, will be described.

Figure 9:
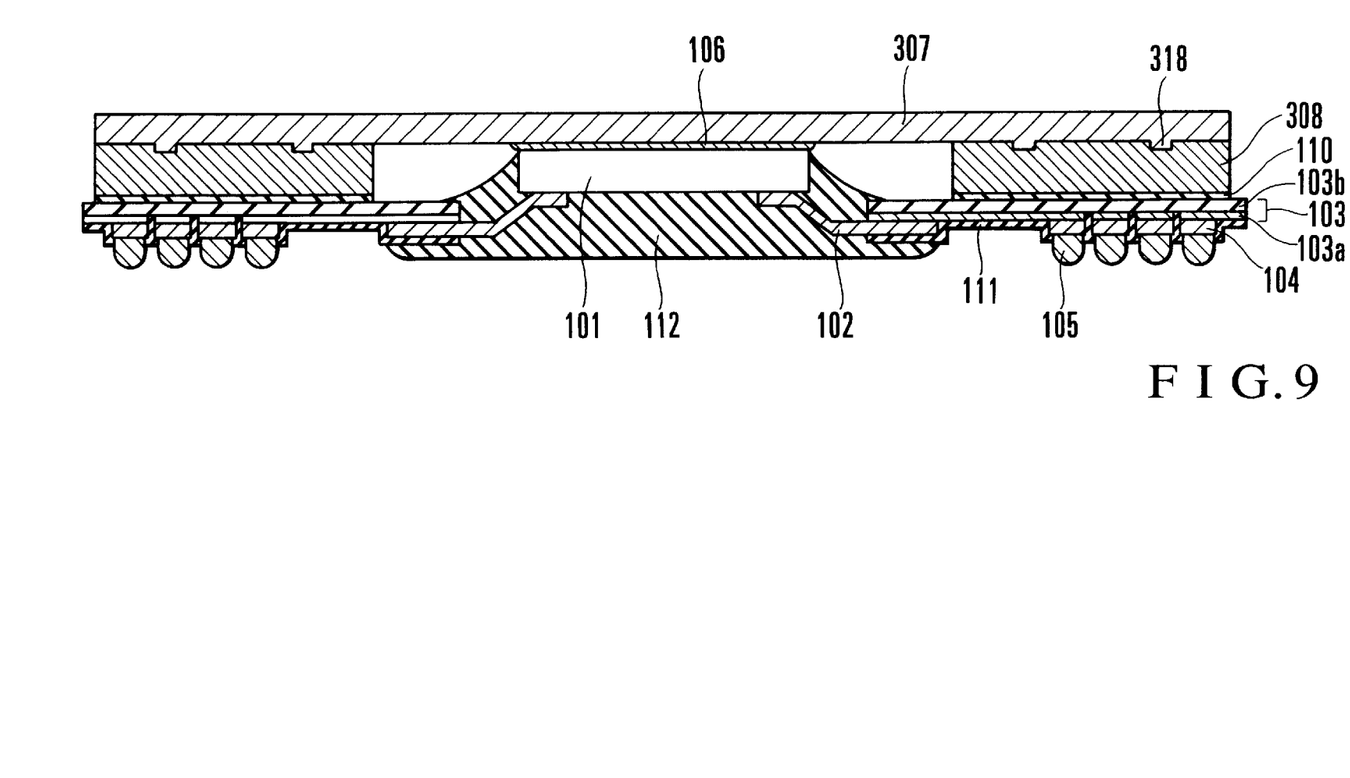
FIG. 9 is a sectional view of a semiconductor device according to the third embodiment of the present invention.

FIG. 9 shows a semiconductor device according to the third embodiment of the present invention. Referring to FIG. 9, the same elements as those in FIG. 1 are denoted by the same reference numerals as in FIG. 1, and a detailed description thereof will be omitted. The difference between FIGS. 9 and 1 resides in that, in FIG. 9, a support ring 308 is fabricated from a heat-resistant resin, e.g., an epoxy resin containing silica, alumina, and the like. Reference numeral 308 denotes the support ring; and 318, a plurality of projections.

The steps in bonding a heat spreader 307 and the support ring 308 to each other will be described.

In order to increase the adhesive power, the plurality of projections 318 are formed on the heat spreader 307 in advance. A molten epoxy resin having fluidity is charged into a mold, and the heat spreader 307 is placed on the epoxy resin while burying the projections 318 in the epoxy resin. Then, the epoxy resin is solidified by cooling to form the support ring 308 fixed to the heat spreader 307.

According to this embodiment, the fixing force generated by solidification of the epoxy resin is utilized. The support ring 308 can be bonded to the heat spreader 307 without using an adhesive.

Any resin other than the epoxy resin may be used as far as it can achieve a sufficiently high strength as the support ring and has a sufficiently high heat resistance. The number and shape of the projections 318 may be arbitrarily set to obtain a desired bonding power.

Figure 10:
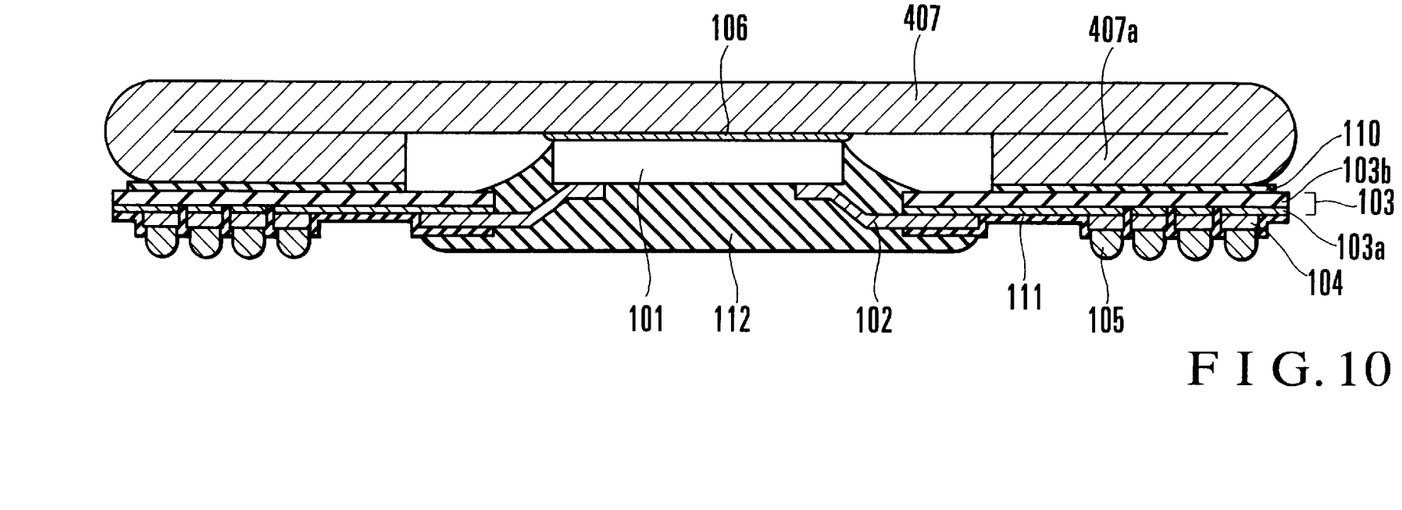
FIG. 10 is a sectional view of a semiconductor device according to the fourth embodiment of the present invention.

FIG. 10 shows a semiconductor device according to the fourth embodiment of the present invention. Referring to FIG. 10, the same elements as those in FIG. 1 are denoted by the same reference numerals as in FIG. 1, and a detailed description thereof will be omitted. The difference between FIGS. 10 and 1 resides in that, in FIG. 10, peripheral portions 407a of a heat spreader 407 are bent through about 180°, and the bent peripheral portions 407a are utilized to form a support ring.

Accordingly, an exclusive support ring need not be formed, and the number of components is decreased, so that the semiconductor device can be provided at low cost.

The steps in manufacturing the heat spreader 407 will be described with reference to FIGS. 11A and 11B.

Figure 11A:
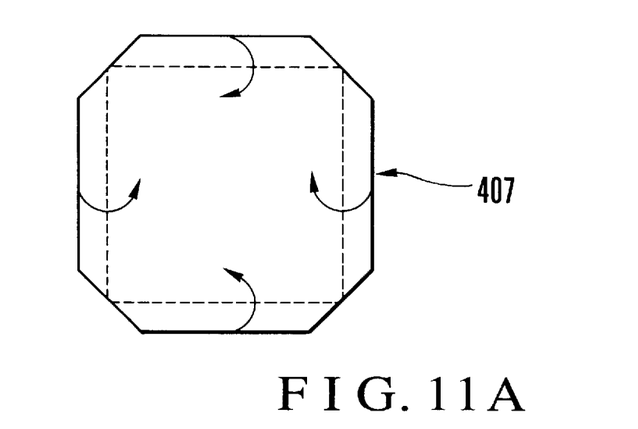
FIGS. 11A and 11B are views showing the steps in a method of manufacturing the heat spreader shown in FIG. 10.
Figure 11B:
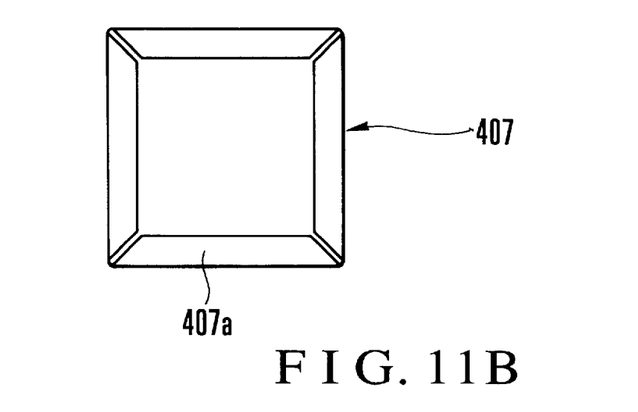

As shown in FIG. 11A, a copper plate (thickness: about 0.2 m to 0.4 m) for forming the heat spreader is cut into an octagonal shape in advance. The peripheral portions 407a are bent through 180° to fabricate the square heat spreader 407, as shown in FIG. 11B.

When this embodiment is used, an exclusive component for forming the support ring need not be prepared, and the number of components can accordingly be decreased to be smaller than that in the conventional example. Since the support ring member can be formed by only bending, the manufacturing process becomes very simple. When the area of the bent peripheral portions 407a is set to be equal to or larger than that of regions where bump electrodes 105 are to be formed, the peripheral portions 407a can serve as the support when forming the bump electrodes 105.

When the heat spreader is mounted on the semiconductor chip 101, air sealed together with the semiconductor chip 101 sometimes swells to break the package. This problem can be solved by the following countermeasure.

Figure 12:
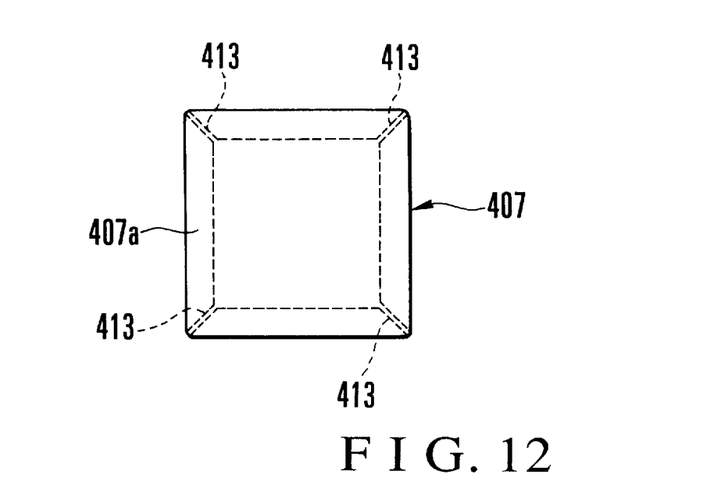
FIG. 12 is a plan view showing an improvement in the heat spreader shown in FIG. 10.

FIG. 12 shows the heat spreader 407 shown in FIG. 10. As shown in FIG. 12, when gaps 413 are formed among the bent peripheral portions 407a, the sealed air communicates with the external air, so that the swelled air can be released to the outside.

FIGS. 13 to 16 show modifications of the semiconductor device shown in FIG. 10.

Figure 13:
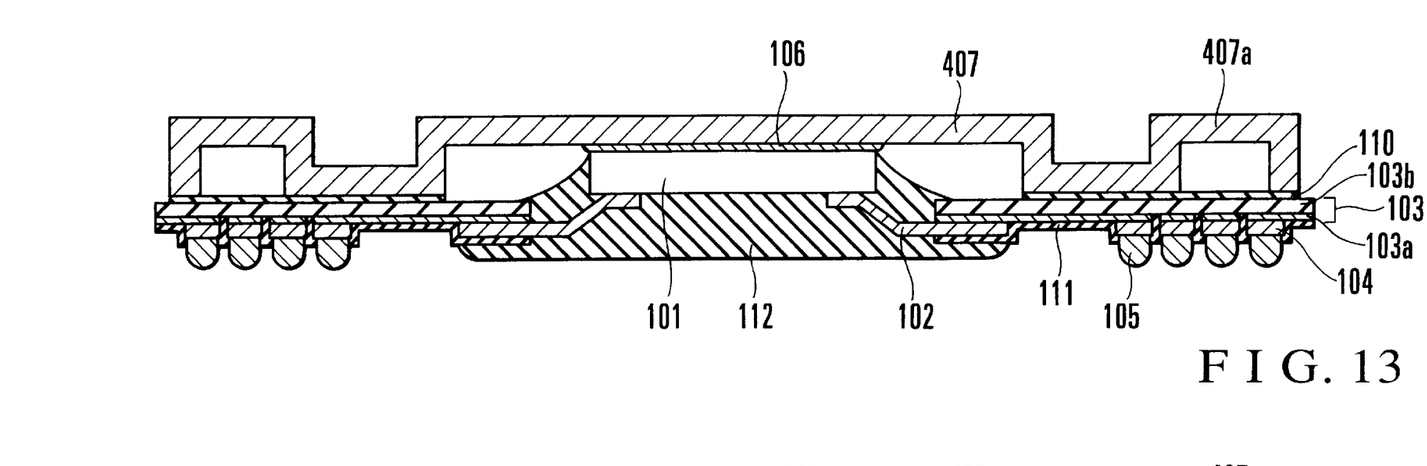
FIG. 13 is a sectional view showing a modification of the semiconductor device shown in FIG. 10.

In FIG. 13, peripheral portions 407a of a heat spreader 407 are bent such that their edge surfaces oppose TAB tapes 103, so that they have an S-shaped/inverted S-shaped (in a shape of number 5 or inverted 5) section.

Figure 14:
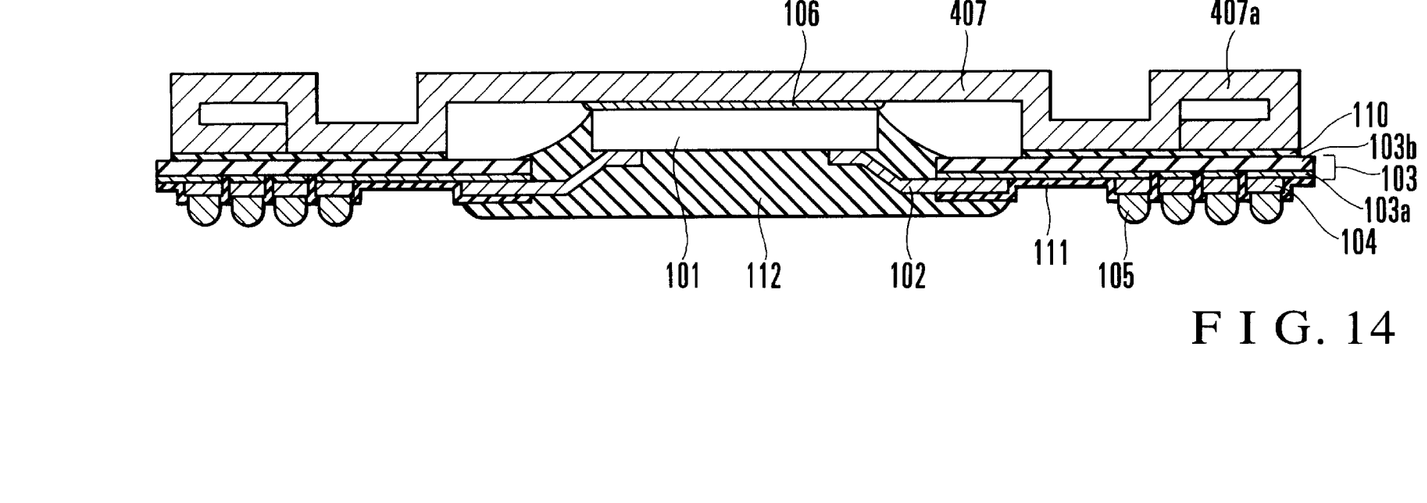
FIG. 14 is a sectional view showing another modification of the semiconductor device shown in FIG. 10.

In FIG. 14, peripheral portions 407a of a heat spreader 407 are further bent toward a semiconductor chip 101 from the state of FIG. 11, so that they have a section in a shape of number 9 or inverted 9.

Figure 15:
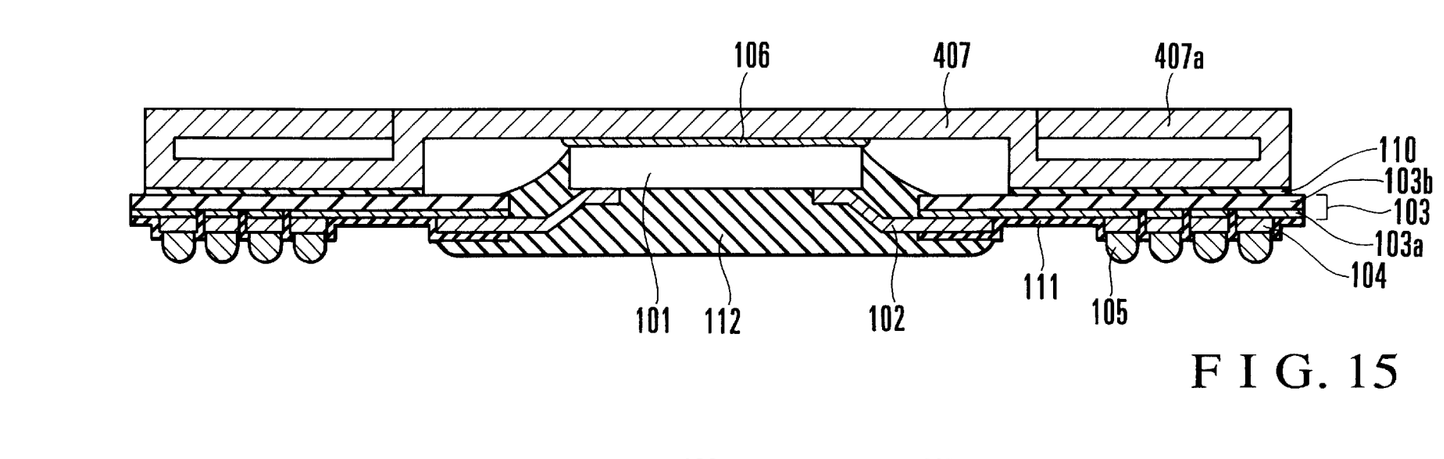
FIG. 15 is a sectional view showing still another modification of the semiconductor device shown in FIG. 10.

In FIG. 15, peripheral portions 407a of a heat spreader 407 are bent such that their edge surfaces are directed in a direction opposite to TAB tapes 103, so that they have an O-shaped section.

Figure 16:
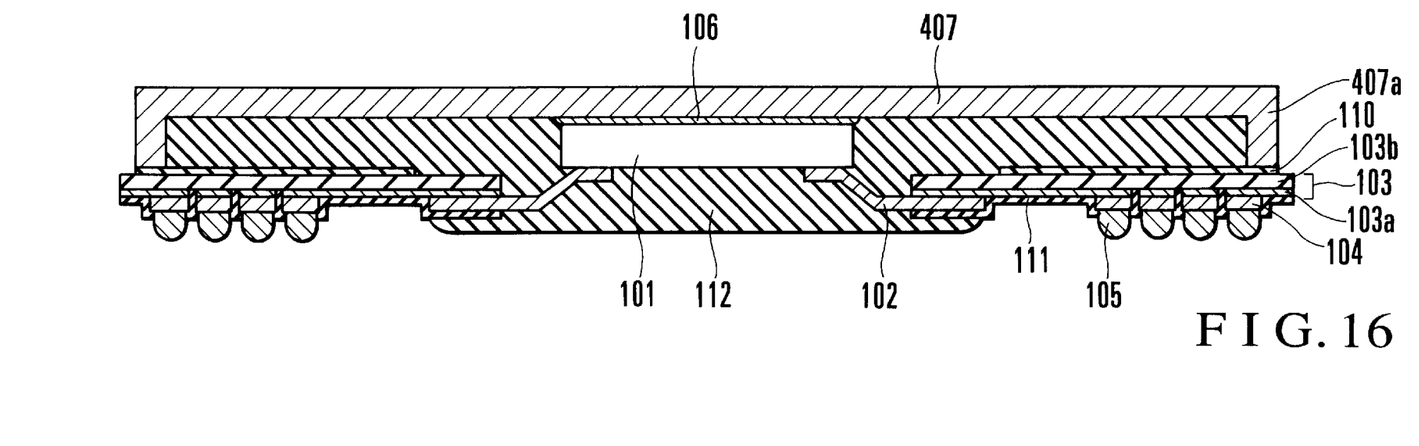
FIG. 16 is a sectional view showing still another modification of the semiconductor device shown in FIG. 10.

In FIG. 16, peripheral portions 407a of a heat spreader 407 are bent such that their edge faces are directed toward TAB tapes 103, so that they have an L-shaped section. At this time, the space between the heat spreader 407 and TAB tape 103 is filled with a potting resin 112.

As has been described above, according to the present invention, the heat spreader and support ring can be bonded to each other without using an adhesive. Therefore, the heat spreader can be prevented from separating from the support ring due to heat history.

What is claimed is:

1. A method of manufacturing a semiconductor device comprising:
   a tape carrier constituted by a TAB (Tape Automated Bonding) tape;
   a semiconductor chip mounted on said tape carrier;
   a metal heat spreader fixed to a surface of said semiconductor chip opposite to said tape carrier to dissipate heat generated in said semiconductor chip, said heat spreader having a shape larger than that of said semiconductor chip; and
   a reinforcing member arranged between said heat spreader and said tape carrier and adhered to said tape carrier, said reinforcing member serving to ensure a predetermined gap between said heat spreader and said tape carrier and to prevent warp of said tape carrier,
   comprising the step of bonding said heat spreader and said reinforcing member to each other by employing one of mechanical engagement and fusion welding.

2. A method according to claim 1, wherein
   said reinforcing member is made of a metal, and
   the bonding step comprises the step of bonding said heat spreader and said reinforcing member to each other by caulking.

3. A method according to claim 1, wherein
   said reinforcing member is made of a metal, and
   the bonding step comprises the step of bonding said heat spreader and said reinforcing member to each other by spot welding.

4. A method according to claim 1, wherein
   said reinforcing member is made of a heat-resistant resin,
   said heat spreader has a projection, and
   the bonding step comprises the steps of
      bringing said heat spreader and said resin into contact with each other to bury said projection in said resin, and
      solidifying said resin to bond said heat spreader and reinforcing member to each other through said projection.

5. A method of manufacturing a semiconductor device comprising:
   a tape carrier constituted by a TAB (Tape Automated Bonding) tape;
   a semiconductor chip mounted on said tape carrier; and
   a metal heat spreader fixed to a surface of said semiconductor chip opposite to said tape carrier to dissipate heat generated in said semiconductor chip, said heat spreader having a shape larger than that of said semiconductor chip,
   comprising the steps of
      bending an edge of said heat spreader, and
      bonding a bent portion and said tape carrier to each other to ensure a predetermined gap between said heat spreader and said tape carrier.

6. A method according to claim 5, wherein the bending step comprises the step of bending said edge of said heat spreader toward said semiconductor chip through about 180°.

7. A method according to claim 5, wherein the bending step comprises the step of forming a gap between bent portions.

8. A semiconductor device comprising:
   a tape carrier constituted by a TAB (Tape Automated Bonding) tape;
   a semiconductor chip mounted on said tape carrier;
   a metal heat spreader fixed on a surface of said semiconductor chip opposite to said tape carrier to dissipate heat generated in said semiconductor chip, said heat spreader having a shape larger than that of said semiconductor chip;
   a reinforcing member arranged between said heat spreader and said tape carrier and adhered to said tape carrier, said reinforcing member serving to ensure a predetermined gap between said heat spreader and said tape carrier and to prevent warp of said tape carrier; and
   a bonding structure for bonding said heat spreader and said reinforcing member to each other by employing one of mechanical engagement and fusion welding.

9. A semiconductor device according to claim 8, wherein said bonding structure comprises
   an engaging projection formed on one of said heat spreader and said reinforcing member, and
   an engaging recess formed in the other of said heat spreader and said reinforcing member to fit on said engaging projection.

10. A semiconductor device according to claim 9, wherein said engaging recess comprises an engaging hole.

11. A semiconductor device according to claim 9, wherein said engaging recess comprises a through hole, and
said engaging projection has a length larger than a thickness of one of said heat spreader and said reinforcing member where said through hole is formed.

12. A semiconductor device according to claim 1, wherein said reinforcing member is made of a metal, and
said bonding structure comprises a welding portion that fusion-welds said heat spreader and said reinforcing member by spot welding.

13. A semiconductor device according to claim 1, wherein said reinforcing member is made of a heat-resistant resin,
said bonding structure has a projection formed on said heat spreader, and
said projection is buried in said resin, and said resin is solidified while being in contact with said heat spreader, thereby bonding said reinforcing member and said heat spreader to each other.

14. A semiconductor device comprising:
a tape carrier constituted by a TAB (Tape Automated Bonding) tape;
a semiconductor chip mounted on said tape carrier;
a metal heat spreader fixed to a surface of said semiconductor chip opposite to said tape carrier to dissipate heat generated in said semiconductor chip, said heat spreader having a shape larger than that of said semiconductor chip; and
a reinforcing portion constituted by a peripheral portion of said heat spreader which is bent toward said tape carrier, said reinforcing portion serving to ensure a predetermined gap between said heat spreader and said tape carrier and to prevent warp of said tape carrier.

15. A semiconductor device according to claim 14, wherein said reinforcing portion is constituted by said peripheral portion of said heat spreader which is bent from a tape carrier side toward said semiconductor chip through about 180°.

16. A semiconductor device according to claim 14, wherein said reinforcing portion is constituted by said peripheral portion of said heat spreader which is bent toward said tape carrier to have an S-shaped/inverted S-shaped section.

17. A semiconductor device according to claim 14, wherein said reinforcing portion is constituted by said peripheral portion of said heat spreader which is bent toward said tape carrier to have a section in a shape of number 9 or inverted 9.

18. A semiconductor device according to claim 14, wherein said reinforcing portion is constituted by said peripheral portion of said heat spreader which is bent toward said tape carrier to have an O-shaped section.

19. A semiconductor device according to claim 14, wherein
said reinforcing portion is constituted by a plurality of bent portions formed by bending said peripheral portion of said heat spreader at a plurality of portions, and adjacent ones of said bent portions form a gap.

* * * * *